United States Patent
Nakamura et al.

(10) Patent No.: US 9,469,916 B2
(45) Date of Patent: Oct. 18, 2016

(54) METHOD OF PRODUCING GAAS SINGLE CRYSTAL AND GAAS SINGLE CRYSTAL WAFER

(75) Inventors: Ryoichi Nakamura, Yurihonjo (JP); Motoichi Murakami, Akita (JP); Takehiro Miyaji, Akita (JP)

(73) Assignee: DOWA ELECTRONICS MATERIALS CO., LTD., Tokyo (JP)

(*) Notice: Subject to any disclaimer, the term of this patent is extended or adjusted under 35 U.S.C. 154(b) by 320 days.

(21) Appl. No.: 14/122,042

(22) PCT Filed: May 16, 2012

(86) PCT No.: PCT/JP2012/003204
§ 371 (c)(1),
(2), (4) Date: Jan. 30, 2014

(87) PCT Pub. No.: WO2012/160781
PCT Pub. Date: Nov. 29, 2012

(65) Prior Publication Data
US 2014/0205527 A1    Jul. 24, 2014

(30) Foreign Application Priority Data
May 25, 2011    (JP) .................. 2011-117420

(51) Int. Cl.
*C30B 11/04*    (2006.01)
*C30B 11/00*    (2006.01)
*C30B 27/00*    (2006.01)
*C30B 29/42*    (2006.01)

(52) U.S. Cl.
CPC ............ *C30B 11/006* (2013.01); *C30B 11/00* (2013.01); *C30B 27/00* (2013.01); *C30B 29/42* (2013.01)

(58) Field of Classification Search
CPC ...... C30B 11/00; C30B 11/04; C30B 11/065
See application file for complete search history.

(56) References Cited

U.S. PATENT DOCUMENTS

| 5,612,014 A | * | 3/1997 | Inoue | C30B 11/00 117/2 |
| 6,325,849 B1 | * | 12/2001 | Hideo | C30B 11/00 117/82 |
| 2011/0059294 A1 | * | 3/2011 | Oshika | C30B 11/00 428/141 |

FOREIGN PATENT DOCUMENTS

| DE | 699 14 540 T2 | 2/2005 |
| EP | 0 971 052 B1 | 2/2004 |
| JP | H06-219900 A | 8/1994 |
| JP | A-08-151290 | 6/1996 |
| JP | A-10-259100 | 9/1998 |
| JP | A-10-279398 | 10/1998 |
| JP | A-2000-086398 | 3/2000 |
| JP | 2000-109400 A | 4/2000 |

OTHER PUBLICATIONS

Jul. 31, 2012 Japanese Office Action issued in Japanese Application No. 2011-117420 (with translation).

(Continued)

*Primary Examiner* — Robert M Kunemund
(74) *Attorney, Agent, or Firm* — Oliff PLC (57) ABSTRACT

A method of producing a GaAs single crystal having high carrier concentration and high crystallinity and to provide a GaAs single crystal wafer using such a GaAs single crystal. In the method of producing a GaAs single crystal, a vertical boat method is performed with a crucible receiving a seed crystal, a Si material, a GaAs material serving as an impurity, solid silicon dioxide, and a boron oxide material, thereby growing a GaAs single crystal.

7 Claims, 4 Drawing Sheets

(56) References Cited

OTHER PUBLICATIONS

May 7, 2013 Japanese Office Action issued in Japanese Application No. 2011-117420 (with translation).
Sep. 17, 2013 Japanese Office Action issued in Japanese Application No. 2011-117420 (with translation).
Aug. 25, 2015 Office Action issued in Chinese Patent Application No. 201280036835.1.
May 20, 2015 Office Action issued in German Patent Application No. 11 2012 002 217.3.
May 17, 2016 Office Action issued in Taiwanese Patent Application No. 101117973.

* cited by examiner

METHOD OF PRODUCING GAAS SINGLE CRYSTAL AND GAAS SINGLE CRYSTAL WAFER

TECHNICAL FIELD

The present invention relates to a method of producing a GaAs single crystal by a vertical boat method and to a GaAs single crystal wafer using such a GaAs single crystal. The present invention particularly relates to a method of producing a GaAs single crystal having high carrier concentration and high crystallinity and a GaAs single crystal wafer using such a GaAs single crystal.

BACKGROUND ART

A GaAs single crystal wafer which is a material of GaAs (gallium arsenic) devices, is produced through steps such as cutting a GaAs single crystal ingot into wafers having a thickness of several hundred μm (slicing) and polishing. Si-doped n-type GaAs single crystal wafers doped with silicon (Si) as an impurity are used as substrates for lasers of DVD players and the like or substrates for light emitting devices such as light emitting diodes (LED).

Here, vertical boat methods such as the vertical gradient freeze method (VGF) and the vertical Bridgman method (VB) are known as methods for producing GaAs single crystal ingots. A vertical boat method is a method in which a seed crystal is placed at the bottom of a crucible, a material melt of a single crystal and a sealant in a liquid form is provided on the seed crystal, and the relevant crucible is cooled from a specific temperature profile, thereby growing a crystal upward from the bottom of the material melt. In the vertical gradient freeze method (VGF), the temperature itself is lowered, whereas in the vertical Bridgman method (VB), the crucible is relatively moved in a specific temperature profile. In producing a Si-doped GaAs single crystal ingot, Si is added into a GaAs melt.

In this method, in order, for example, to prevent As being a volatile component from evaporating from the ingot, $B_2O_3$ (boron oxide) is used as a sealant. In the crystal growth, at the interface between the GaAs melt and the liquid $B_2O_3$, an oxidation-reduction reaction of the following reaction equation is known to occur.

$$3Si \text{ (in Melt)} + 2B_2O_3 = 3SiO_2 \text{(into } B_2O_3\text{)} + 4B \text{ (in Melt)} \quad (1)$$

The balanced chemical equation (1) reaches a state of equilibrium at the start of the growth of a single crystal, and Si is considered to be concentrated into the GaAs melt due to segregation under normal freezing during the single crystal growth.

Here, if the reaction equation (1) proceeds to the right, Si in the GaAs melt decreases, whereas boron (B) is mixed from the liquid sealant into the GaAs melt. The mixing of boron should cause boron arsenide based contamination called scum, and for example, the scum would prevent GaAs from being crystallized into a single crystal, or would cause slip dislocations and threading dislocations, which results in lower quality of the GaAs single crystal.

JP 03-057079 A (PTL 1) discloses a technique of performing crystal growth with the equilibrium of the above balanced chemical equation (1) lying toward the left using a sealant of $B_2O_3$ into which silicon oxide is previously added. Meanwhile, JP 2000-109400 A (PTL 2) discloses a technique of stirring a liquid sealant during crystal growth in order to produce a Si-doped GaAs single crystal having uniform carrier concentration profile.

CITATION LIST

Patent Literature

PTL 1: JP 03-057079 A
PTL 2: JP 2000-109400 A

SUMMARY OF INVENTION

Technical Problem

In the vertical boat method, since a crystal is grown upward from the bottom of a material melt, impurities which have not been incorporated into the crystal are concentrated in the melt. If a large amount of dopant Si (that is, a Si crystal to be charged together with a GaAs material) is added into a GaAs melt in order to increase the carrier concentration, the equilibrium of the balanced chemical equation (1) lies to the right, and a large amount of boron (B) migrates into the GaAs melt. Accordingly, as the crystal growth proceeds and the impurities are concentrated, generation of boron arsenide is also promoted, which makes it impossible to achieve high crystallinity. In other words, the carrier concentration and the crystallinity of a GaAs single crystal are trade-offs. Among n-type conductivity GaAs wafers that are commonly used at present, ones having a carrier concentration of $1 \times 10^{18}$ cm$^{-3}$ to $2 \times 10^{18}$ cm$^{-3}$ are in the mainstream; however, in recent years, there are increasing demands for high carrier concentration GaAs wafers having a carrier concentration exceeding $2 \times 10^{18}$ cm$^{-3}$.

The inventors of the present invention added Si of an amount required to achieve a carrier concentration exceeding $2 \times 10^{18}$ cm$^{-3}$ into a melt, thus producing a Si-doped GaAs single crystal by methods disclosed in PTL 1 and PTL 2. However, even if a region having a carrier concentration exceeding $2 \times 10^{18}$ cm$^{-3}$ can be obtained in the latter half of crystal growth, the concentration of B in an ingot becomes excessively high with the addition of Si, which reduces the crystallinity as described above. Specifically, there has been a problem of high etch pit density (EPD) of a wafer obtained from the ingot, which has a carrier concentration exceeding $2 \times 10^{18}$ cm$^{-3}$. Thus, it was found that the techniques of PTL 1 and PTL 2 cannot achieve the Si concentration and the boron concentration (carrier concentration and crystallinity) of currently required levels in a compatible manner.

In view of the above problem, it is therefore an object of the present invention to provide a method of producing a GaAs single crystal having high carrier concentration and high crystallinity and to provide a GaAs single crystal wafer using such a GaAs single crystal.

Solution to Problem

In further studies to achieve the object, the inventors focused on the impurity hardening effect of boron (B) as an impurity, in the process of attempting to reduce dislocations in a GaAs single crystal. Impurity hardening is also referred to as solid solution hardening, which is a phenomenon in which impurity atoms dissolved as substitutional or interstitial ones in a material increases the strength. The impurity hardening effect can reduce dislocations by interactions between solute atoms and dislocations. In general, GaAs is known to be greatly influenced by the impurity hardening effect of Si. However, through further investigations, the inventors found that the impurity hardening effect can also be recognized in cases where an appropriate amount of boron is contained in GaAs, although the effect is not as large as in the case of Si. Subsequently, they found that the amount of impurities can be controlled such that the B concentration in the GaAs single crystal is in the range of $1.9 \times 10^{18}$ cm$^{-3}$ to $6 \times 10^{18}$ cm$^{-3}$ in order to realize sufficiently low EPD by achieving the impurity hardening effect of boron (B) as well as suppressing generation of boron arsenide in the GaAs melt. To that end, they discussed various designs of crystal growth systems in order to achieve a B concentration within the above range even at a high Si concentration thereby disturbing the equilibrium of the above balanced chemical equation (1). Finally, the inventors found that the above object can be achieved by placing solid silicon dioxide (SiO$_2$) between a GaAs material and a boron oxide material serving as a sealant in storing the materials. Thus, they completed the present invention.

In view of the above problem, the present invention primarily includes the following components.
(1) A method of producing a GaAs single crystal, wherein a vertical boat method is performed with a crucible storing a seed crystal, a Si material serving as an impurity, a GaAs material, a solid silicon dioxide, and a boron oxide material, thereby growing a GaAs single crystal.
(2) The method of producing a GaAs single crystal according to (1) above, wherein SiO$_2$ is previously added into the boron oxide material, and the sum of an amount of Si of SiO$_2$ in the boron oxide material and an amount of Si in the solid silicon dioxide exceeds 5 mass % of the boron oxide material.
(3) The method of producing a GaAs single crystal according to (1) or (2) above, wherein in a specific period in the growth of the GaAs single crystal, liquid boron oxide which is a melt of the boron oxide material is stirred.
(4) A Si-doped GaAs single crystal wafer, wherein a carrier concentration is higher than $2 \times 10^{18}$ cm$^{-3}$, and the maximum value of an etch pit density is 500 cm$^{-2}$ or less.

Advantageous Effect of Invention

According to the present invention, solid silicon dioxide is placed between a GaAs material and a boron oxide material serving as a sealant in storing the materials, and a GaAs single crystal is grown by a vertical boat method, so that the boron (B) concentration can be suppressed to a low level even at a high carrier concentration. As a result, a GaAs single crystal having high carrier concentration and high crystallinity all over an ingot can be produced. Further, using this GaAs single crystal, a GaAs single crystal wafer having high carrier concentration and high crystallinity can be obtained.

DESCRIPTION OF EMBODIMENTS

Embodiments of the present invention will be described below with reference to the drawings.
(Single Crystal Production Apparatus)

Figure 1:
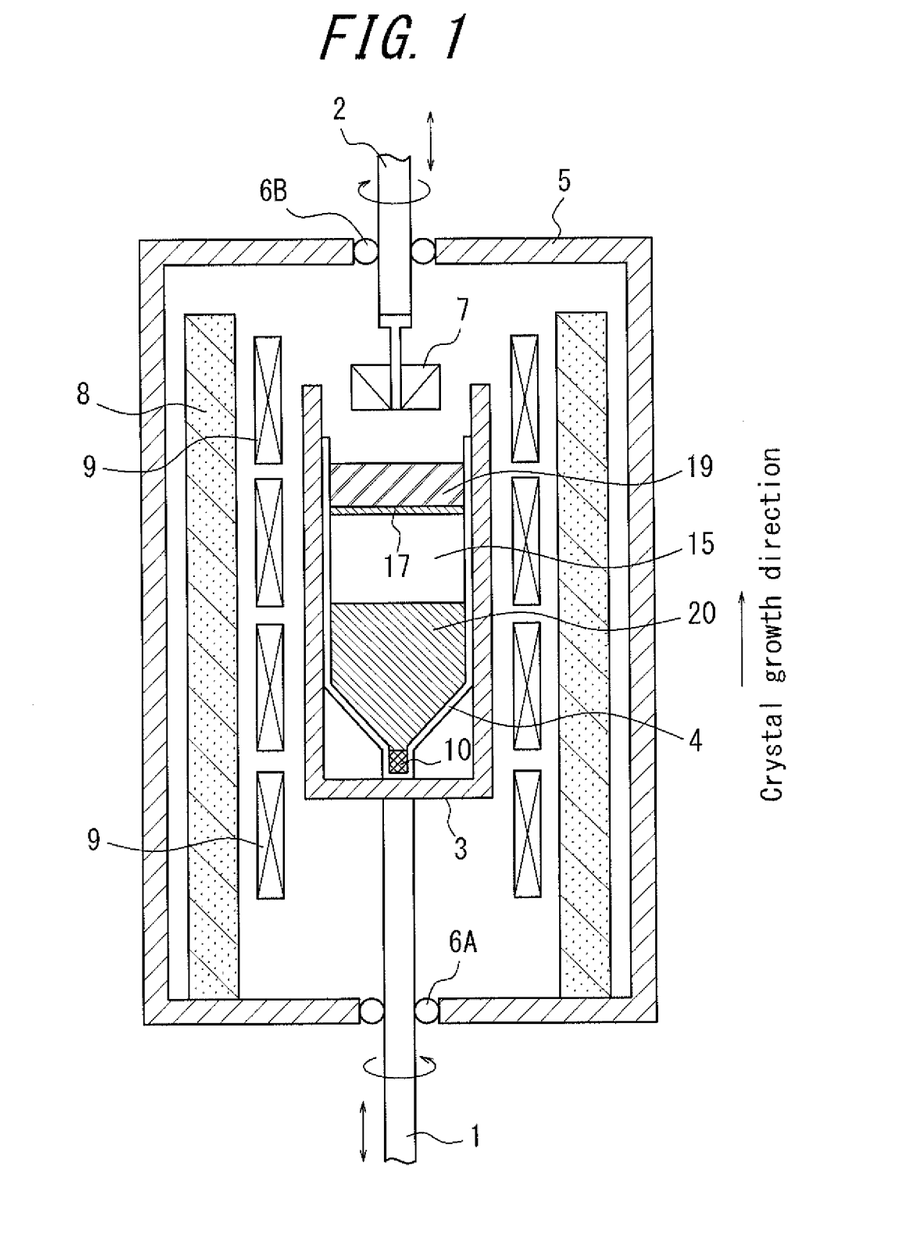
FIG. 1 is a cross-sectional view schematically showing a single crystal production apparatus used for a method of producing a GaAs single crystal according to the present invention (before stirring).

First, a single crystal production apparatus used for a method of producing a GaAs single crystal according to an embodiment of the present invention will be described with reference to FIG. 1. A production method of this embodiment uses a vertical boat method (vertical gradient freeze method and vertical Bridgman method). FIG. 1 is a cross-sectional view schematically showing the structure of a single crystal production apparatus for performing a vertical boat method. Crystal growth is performed with materials being stored in a crucible 4. The crucible 4 has an approximately cylindrical shape, the top of it is opened, the diameter of the crucible is gradually reduced toward the bottom such that the cross-sectional shape is tapered, and a seed crystal 10 is stored in a small diameter portion at the very bottom.

The crucible 4 is received in a cylindrical crucible receiving container 3 having a floor. The crucible receiving container 3 is supported by a lower rod 1. This lower rod 1 is liftable and rotatable with a driving mechanism not shown in the diagram, and can raise/lower and rotate the crucible receiving container 3 and the crucible 4 received in the crucible receiving container 3.

The crucible receiving container 3 is provided inside a cylindrical heater 9. This heater 9 includes a plurality of heaters capable of individually setting temperatures, so that the desired temperature gradient and temperature profile can be achieved in the crucible receiving container 3. A cylindrical heat insulator 8 is placed outside the heater 9, and both of them are received in an airtight container 5.

A hole is formed at the bottom of the airtight container 5 so that the lower rod 1 can pass therethrough, and a sealing ring 6A is fitted in the hole such that the lower rod 1 can be lifted and rotated while keeping the airtight container 5 airtight. Further, a hole is formed at the top of the airtight container 5 so that an upper rod 2 can pass therethrough, and a sealing ring 6B is fitted in the hole such that the upper rod 2 can be lifted and rotated while keeping the airtight container 5 airtight.

The upper rod 2 is liftable and rotatable with a driving mechanism not shown in the diagram, and a stirring plate 7 is attached to an end of it. The stirring plate 7 is one approximately quadrangular plate body attached approximately perpendicularly to an attachment portion at the end of the upper rod 2. The plate body of the stirring plate 7 preferably has a lateral width equal to or more than ½ of the inner diameter of the crucible 4 and a longitudinal width equal to or more than ½ of the thickness of a liquid sealant layer to be described layer. Further, two or more such bodies may be provided. Moreover, as a general rule, the stirring plate 7 may have any shape as long as it can stir the melt of boron oxide (B$_2$O$_3$) which is the liquid sealant.

FIG. 1 shows a state inside the crucible where a GaAs single crystal is grown, and a Si-doped GaAs single crystal grown as a solidified portion 20 lies under a GaAs melt that is a melted portion 15. Note that the crucible 4 and the stirring plate 7 are required to be made of a material which has necessary heat resistance and does not easily react with the material melt; for example, quartz or graphite which is covered by pyrolytic boron nitride (PBN) can be used. This apparatus can be employed in a method of adjusting the temperature gradient of the heater 9 by fixing the vertical position of the crucible 4 (vertical gradient freeze method) or in a method of changing the vertical position of the crucible 4 while fixing the temperature gradient of the heater 9 (vertical Bridgman method), both of which are performed to achieve an appropriate temperature gradient.

(Method of Producing GaAs Single Crystal)

A method of producing a GaAs single crystal according to an embodiment of the present invention will now be described with reference to FIGS. 1 to 3. In this production method, as shown in FIG. 3, a vertical boat method is characteristically performed with the crucible 4 receiving a seed crystal 10, a Si material 12 and a GaAs material 14 serving as impurities, solid silicon dioxide 16, for example, a disc-shaped quartz plate, and a boron oxide material 18 in this order, thereby growing a GaAs single crystal 20. With such a structure, the B concentration can be suppressed to a low level even at a high carrier concentration. As a result, a GaAs single crystal having high carrier concentration and high crystallinity can be produced.

The embodiment will described below in detail. In this embodiment, a Si-doped GaAs single crystal is produced using the above described single crystal production apparatus as follows. First, as shown in FIG. 3, the crucible 4 receives the seed crystal 10, the Si material 12 and the GaAs material 14 serving as impurities (dopants), the quartz plate 16, and the $B_2O_3$ material 18 as a liquid sealant material.

Next, the crucible 4 receiving these materials is placed inside the apparatus, and a vertical boat method is performed as follows. First, the airtight container 5 is evacuated and the content is replaced with an inert gas such as argon (Ar) or nitrogen, thereby pressurizing the content of the container to 3 to 9 atmospheres. Then, the crucible 4 is heated with the heater 9 to melt the materials except for the seed crystal 10. At this point, the inside of the crucible 4 is heated approximately to 1200° C. to 1450° C. Here, the melting point of the dopant Si material 12 is 1420° C., whereas the melting point of the GaAs material 14 is 1240° C. The softening point of the boron oxide material 18 is about 550° C., whereas the melting point (softening point) of silicon dioxide is 1700° C. Accordingly, after starting heating, first, the boron oxide material 18 is softened to form liquid boron oxide 19. Next, the GaAs material 14 is melted to form a GaAs melt 15. In this process, part of the Si material 12 is dissolved in the GaAs melt 15, and the other part of the Si material 12 is incorporated as $SiO_2$ in the liquid boron oxide 19. Meanwhile, the quartz plate 16 is gradually dissolved into the liquid boron oxide 19 concurrently. While the dissolution of the quartz plate 16 proceeds, the quartz plate 16 is positioned at the interface between the GaAs melt 15 and the liquid $B_2O_3$ 19 in terms of the specific weight. Whether the quartz plate is completely dissolved or partially left undissolved due to saturation will be described below. Note that the reason that the quartz plate 16 is further dissolved in the liquid boron oxide 19 in which Si is previously dissolved is considered because a state where the solubility limit of Si in boron oxide is raised due to the high temperature inside the crucible 4, and Si can be dissolved to the solubility limit can be established by the present invention.

Subsequently, the upper portion of a GaAs seed crystal 10 is melted to blend into the GaAs melt 15, and the GaAs melt 15 is then cooled and solidified from a portion in contact with the seed crystal 10 at the bottom of the crucible 4. Specifically, in the vertical gradient freeze method, the temperature of the heater 9 is gradually lowered. In the vertical Bridgman method, the crucible 4 is moved relatively downward with respect to the heater 9 using the lower rod 1. As the solidification gradually proceeds upward, a GaAs single crystal 20 is grown upward from the seed crystal 10. When the entire amount of GaAs melt 15 is solidified, the temperature of the heater 9 is lowered to cool the crucible 4. At a stage where the temperature of the crucible 4 reaches about room temperature, a furnace of the single crystal production apparatus 1 is opened and the liquid sealant is removed, thereby taking out a GaAs single crystal.

Thus, for the Si-doped GaAs single crystal ingot obtained by starting the heating of the vertical boat method with the solid silicon dioxide 16 being placed between the GaAs material 14 and the boron oxide material 18, the B concentration can be suppressed to a low level even at a high carrier concentration. Specifically, even if the carrier concentration is higher than $2 \times 10^{18}$ cm$^{-3}$, the concentration of B in the GaAs single crystal can be in the range of $1.9 \times 10^{18}$ to $6 \times 10^{18}$ cm$^{-3}$. The reason for this is not perfectly clear; however, the inventors of the present invention presume as follows. That is, in this embodiment, the ratio of solid quartz to be found when the sealant is dissolved with an alcohol after the crystal growth is very small with respect to the initial amount of the quartz plate 16. Since the state of the interface between the sealant (liquid boron oxide 19) and the GaAs melt 15 in the crystal growth cannot be observed, it is difficult to grasp the state of the quartz plate 16 in the series of crystal growth steps of the GaAs single crystal: heating, solidification, and cooling. However, at a time when the materials melt, a layer having an extremely high $SiO_2$ concentration (high $SiO_2$ concentration layer 17) is considered to be already formed in the vicinity of the interface between the GaAs melt 15 and the liquid $B_2O_3$ 19. Thus, the equilibrium of the reaction equation (1) can be significantly shifted to the left from the time when the materials are melted to the time of the crystal growth, and the carrier concentration and the B concentration of the obtained GaAs single crystal 20 are considered to be controlled within the range that could not have been achieved.

The size and shape of the quartz plate 16 (that is, the amount of $SiO_2$ to be added) are not limited in particular, and can be determined in accordance with the production apparatus, the size of the target ingot, and the Si concentration and the B concentration of the target single crystal. For example, the following conditions are preferred. The shape of the solid silicon dioxide 16 may have a spherical shape, a polygonal plate shape, or a doughnut shape, for example; however, the solid silicon dioxide 16 preferably has a circular plate shape to form the high $SiO_2$ concentration layer 17 under the liquid $B_2O_3$ 19 after the melting. Further, the amount of $SiO_2$ added as the solid silicon dioxide 16 is preferably in the range of 3 mass ppm to 6 mass ppm with respect to the liquid $B_2O_3$ 19. When the amount is less than 3 mass ppm, the effect would not be significantly different from the conventional method in which silicon oxide is previously added into $B_2O_3$, whereas the amount exceeds 6 mass ppm, the effect of the present invention would be saturated. Further, when the solid silicon dioxide 16 is a quartz plate, the ratio of the area of the quartz plate 16 to the area of the upper surface of the GaAs melt 15 at the start of the crystal growth is preferably 5% to 99%, more preferably 90% to 99%. When charging a quartz plate 16 having a certain weight, the quartz plate having a wider and thinner shape allows the high $SiO_2$ concentration layer 17 to be easily formed under the $B_2O_3$ after the melting.

Furthermore, $SiO_2$ is preferably added as a Si component into the boron oxide material 18 in advance, and the sum of the amount of Si in $SiO_2$ in the boron oxide material 18 and the amount of Si in the solid silicon dioxide 16 is preferably more than 5 mass % with respect to the mass of the boron oxide material 18. Further, the above ratio is more preferably in the range of more than 5 mass % and 7 mass % or less, and still more preferably in the range of more than 5 mass % and 5.5 mass % or less. In cases where silicon oxide is previously added into $B_2O_3$ serving as a liquid sealant as in PTL 1, silicon oxide can only be dissolved up to 5 mass % and to 3 mass % or less at a normal cost, with respect to the mass of the liquid $B_2O_3$. This is attributed to the difficulty in making the concentration uniform of silicon oxide at high temperatures and in uniformly vitrifying the silicon oxide in cooling in the process of producing $B_2O_3$ in which the silicon oxide is dissolved. However, when the high $SiO_2$ concentration layer 17 is formed under $B_2O_3$ at the time of melting the materials using the quartz plate 16 in charging the materials in the vertical boat method, the amount of $SiO_2$ present in the vicinity of the upper surface of the GaAs melt 15 can be dramatically increased, specifically to a value of Si amount higher than 5 mass %. As a result, the equilibrium of the balanced chemical equation (1) can be greatly shifted to the left.

Note that when a liquid boron oxide 19 in which no Si is dissolved is used, even if the quartz plate 16 having an amount exceeding 5 mass % alone is provided, after the start of the heating in the vertical boat method, only the amount of Si in boron oxide present in the vicinity of the top surface of the GaAs melt 15 is saturated, so that the quartz plate 16 would mostly remain undissolved. Accordingly, it is possible that Si hardly diffuses in the whole boron oxide 19 and the reproducibility of the effect of the present invention is not sufficiently achieved. Thus, using the boron oxide material 18 into which Si is previously added uniformly, the quartz plate 16 is preferably provided such that the amount of Si exceeds 5 mass % with respect to the boron oxide material.

Further, it is preferable to stir $B_2O_3$ which is the liquid sealant 19 in a specific period in the process of the growth of the GaAs single crystal. The stirring can sufficiently achieve the effects of suppressing the B concentration to a low level at desired high carrier concentrations. Since Si in GaAs is normally segregated in the process of solidification of GaAs, the concentration of Si in the crystal formed in a final stage of solidification is four to five times the concentration of Si in the crystal formed in an initial stage of solidification. Since Si serves as a carrier in GaAs, the carrier concentration is also four to five times higher. Here, the $B_2O_3$ part is stirred, and consequently the high $SiO_2$ concentration layer under $B_2O_3$ is also stirred. Thus, the concentration of Si in the layer under $B_2O_3$ which contacts the GaAs melt 15 decreases and Si in the GaAs melt is incorporated in $B_2O_3$, thereby efficiently obtaining crystals having a smaller carrier concentration range. Further, when the concentration of Si in GaAs is as high as about $1 \times 10^{19}/cm^3$, Si serves not only as donors but also as acceptors, which would cancel each other out. Also in this respect, the stirring is desirably performed in the latter half of the crystal growth where Si is segregated at a high carrier concentration.

Figure 2:
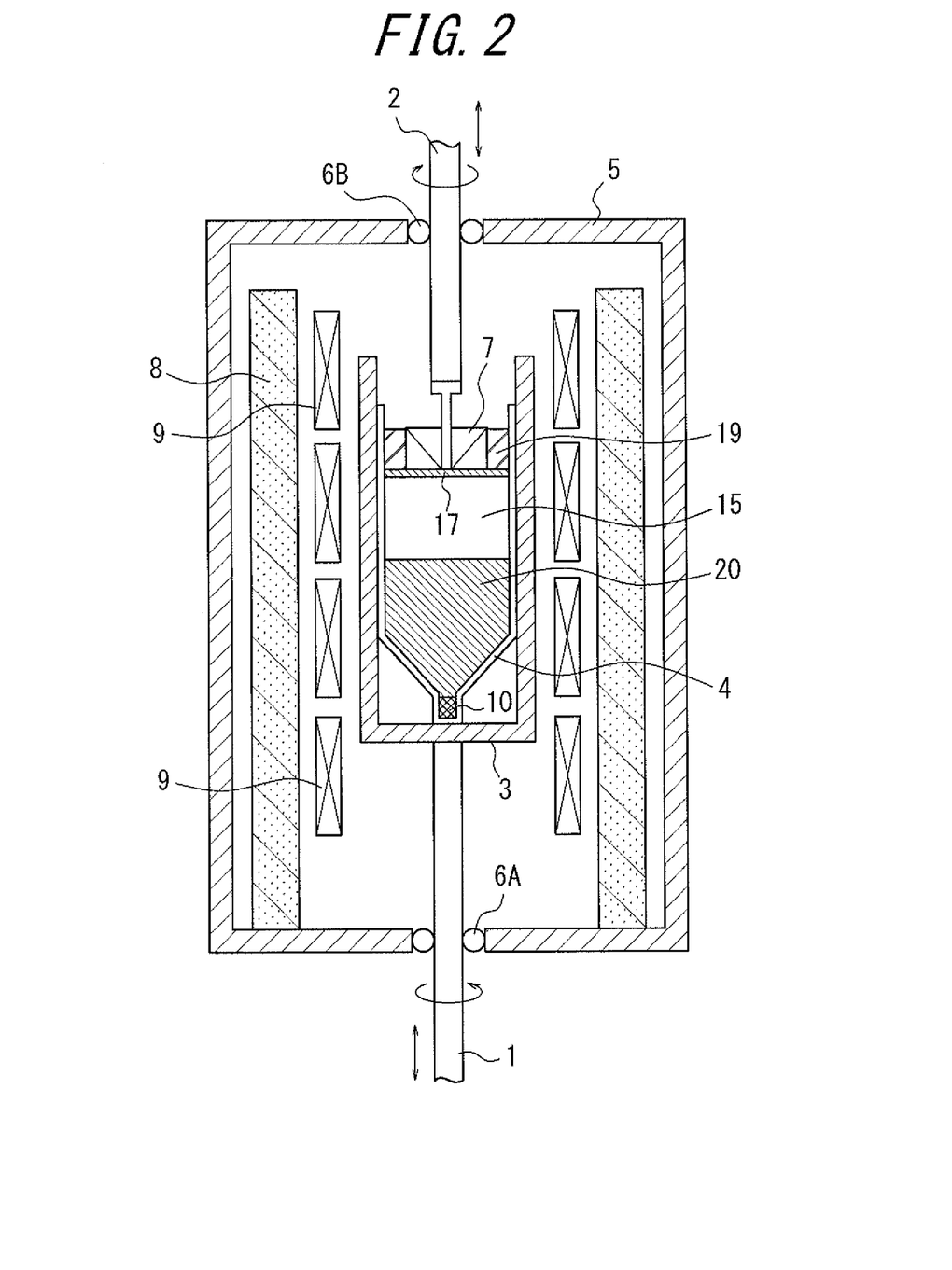
FIG. 2 is a cross-sectional view schematically showing a single crystal production apparatus used for a method of producing a GaAs single crystal according to the present invention (during stirring).
Figure 3:
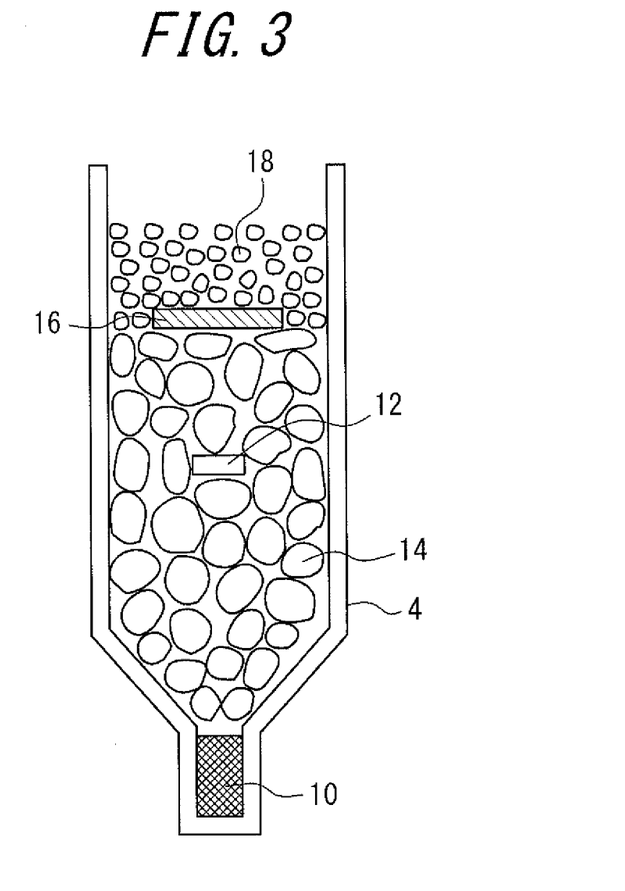
FIG. 3 is a cross-sectional view schematically showing a crucible of a single crystal production apparatus used for a method of producing a GaAs single crystal according to the present invention, showing a state where the crucible is filled with materials before crystal growth.

Specifically, at a specific solidification ratio in the crystal growth, as shown in FIG. 2, the upper rod 2 is moved downward to immerse the stirring plate 7 in the liquid sealant 19, and the upper rod 2 is rotationally driven to rotate the stirring plate 7, thus stirring the liquid sealant 19. The stirring rotation speed is 2 rpm to 4 rpm. Further, the solidification ratio at which stirring is started is 0.05 to 0.4. The solidification ratio at which the stirring is terminated is 0.8 to 1.0. Here, the "solidification ratio" herein means a ratio of the weight of the solidified part to the weight of the whole GaAs material. The solidification ratio increases from 0 to 1 as the solidification proceeds to grow the crystal. Accordingly, the solidification ratio having a certain value means that the interface at which the solidified part contacts the melted part lies in a certain position corresponding to the value of the solidification ratio with a ratio of 1:1. The position specified by this naturally remains the same even after the entire melt is solidified and the crystal is completed. Thus, the position of the completed single crystal in the crystal growth direction can be specified by the solidification ratio.

(Si-Doped GaAs Single Crystal Wafer)

A Si-doped GaAs single crystal wafer according to an embodiment of the present invention will now be described. This wafer can be obtained by slicing, polishing, and the like of an ingot produced by the above production method. For this ingot, even if the carrier concentration is higher than $2 \times 10^{18}$ $cm^{-3}$, the concentration of B in the GaAs single crystal can be in the range of $1.9 \times 10^{18}$ to $6 \times 10^{18}$ $cm^{-3}$. Thus, the wafer of this embodiment characteristically has high crystallinity, where the maximum value of etch pit density EPD is 500 $cm^{-2}$ or less event at a carrier concentration exceeding $2 \times 10^{18}$ $cm^{-3}$. Further, the wafer can have high crystallinity, where the maximum value of etch pit density EPD is 500 $cm^{-2}$ or less even at a carrier concentration exceeding $2.2 \times 10^{18}$ $cm^{-3}$ or $3 \times 10^{18}$ $cm^{-3}$. Furthermore, the mean value of the etch pit density EPD is 25 $cm^{-2}$ or less. Note that the carrier concentration in this embodiment is generally in the range of 2.2 $cm^{-3}$ to $3.5 \times 10^{18}$ $cm^{-3}$. Further, the lower limit of the EPD is not limited in particular, but generally in the range of 0 $cm^{-2}$ to 20 $cm^{-2}$ although it may be zero depending on the wafer in some cases.

In the present invention, the carrier concentration of each wafer is determined by the Hall effect measurement using the Van der Pauw method.

Further, EDP and a method for measuring EDP will be briefly described. For example, if a GaAs single crystal wafer has crystal defects, when this wafer is immersed in a certain corrosive reagent, etching starts at a crystal defect portion, and a pit (cavity) is formed at the portion. Accordingly, the etch pit density, that is, the number of pits formed by etching per unit area, is calculated to evaluate the crystallinity of the wafer. EPD evaluation of a wafer fabricated from a given portion of a Si-doped ingot allows the crystallinity of the relevant Si-doped ingot to be evaluated.

In the EPD measurement method of the present invention, a wafer is etched by immersing it in a KOH (potassium hydroxide) melt at a liquid temperature of 320° C. for 30 min, and resultant pits are observed with an optical microscope. The number of pits is counted in the measurement field of view of 1 $mm^2$ or more (a method according to the standard SEMI M36-0699). Note that the number of points of measurement depends on the area of the wafer; for example, 37 points in a 3-inch diameter wafer.

Further, the maximum value of an EPD means the maximum value among EPDs at a plurality of points of measurement. For present device manufacturing apparatuses using GaAs single crystal wafers, not only the mean value but also the maximum value of EPD are included in the specification. A low maximum value indicates that any part of the wafer is in high quality, and is important also in terms of the yield, thus serving as a suitable indicator for the evaluation of the crystallinity of a wafer.

The above embodiments are only examples of exemplary embodiments of the present invention, and the present invention is not limited to those embodiments. The present invention will be described below in more detail using Examples. However, the present invention is not limited to the following Examples.

EXAMPLES

Example 1

A GaAs single crystal ingot was prepared using a 3-inch diameter GaAs single crystal production apparatus having a structure using a stainless steel chamber shown in FIG. 1 by the procedures described below. A cylindrical PBN made crucible was filled with materials in the following order and was placed at a predetermined position in a chamber.
1. GaAs seed crystal
2. GaAs material: GaAs polycrystal: 6.0 kg and Si crystal: 1200 mg (200 mass ppm with respect to GaAs)
3. Quartz plate (a stack of two disk-shaped plates): 9.1 g
4. $B_2O_3$ material with $SiO_2$ having been previously added, containing 4.0 mass % of Si: 360 g Observed from above the crucible, the inner diameter of the crucible is 80 mm, whereas the diameter of the quartz plate is 75 mm. Further, the sum of the amount of Si in the $B_2O_3$ material and the amount of Si in the quartz plate was 18.7 g, which corresponds to 5.2 mass % of the mass of $B_2O_3$ material: 360 g.

Subsequently, the apparatus was evacuated, and the content was replaced with an Ar gas and pressurized to 6 atmospheres. The crucible was heated with a heater to pressurize the content to 8 atmospheres, thus melting an upper part of the GaAs material, the Si material, and the seed crystal. Thereafter, the pressure of 8 atmospheres was maintained until the end of crystal growth. At a point when the upper part of the GaAs material, the Si material, and the seed crystal melted, the $B_2O_3$ material melted over a GaAs melt, which prevented As from being released from the GaAs material melt. After that, the heater temperature was lowered from the seed crystal side, thereby solidifying the entire material melt to grow a 3-inch diameter crystal. Note that in the crystal growth, in order to suppress excessive increase in the concentration of Si in the melt due to segregation, the liquid $B_2O_3$ was stirred from a solidification ratio of 0.33 to the end of the growth by rotating the stirring plate at 2 rpm. After the entire GaAs melt was solidified, the temperature of the heater was lowered to cool the crucible. At a stage where the temperature of the crucible reached about room temperature, a furnace of the single crystal production apparatus was opened to take out a GaAs single crystal. Here, when a sealant was dissolved with alcohol to be removed in order to take out the crystal, bulks of quartz (1.5 g in total) were found. This is considered because the quartz plate was not dissolved in the sealant or was reprecipitated after once being dissolved.

For the thus obtained single crystal ingot, wafers were cut out from three portions having solidification ratios of 0.1 (seed side), 0.45 (middle position), and 0.8 (tail side). The Si concentration, the B concentration, the carrier concentration, and the EPD (mean value and maximum value) of the wafers were measured. The Si concentration and the B concentration were measured by ICP. The carrier concentration and the EPD were measured by the method described above.

Example 2

An ingot was prepared by the same method as Example 1 except that the amount of Si crystal added as a dopant to GaAs polycrystal was 2100 mg (350 mass ppm with respect to GaAs) and the quartz plate weighed 9.5 g. Resultant wafers were evaluated. The sum of the amount of Si in the $B_2O_3$ material and the amount of Si in the quartz plate was 18.8 g, which corresponds to 5.2 mass % of the mass of the $B_2O_3$ material: 360 g. Note that when a sealant was dissolved with alcohol to be removed in order to take out the crystal, bulks of quartz (0.2 g in total) were found, which is considered because the quartz plate was not dissolved in the sealant or was reprecipitated after once being dissolved.

Example 3

An ingot was prepared by the same method as Example 1 except that the liquid $B_2O_3$ was not stirred and the quartz plate weighed 9.6 g. The resultant wafers were evaluated. The sum of the amount of Si in the $B_2O_3$ material and the amount of Si in the quartz plate was 18.9 g, which corresponds to 5.2 mass % of the mass of the $B_2O_3$ material: 360 g. Note that when a sealant was dissolved with alcohol to be removed in order to take out the crystal, bulks of quartz (1.1 g in total) were found, which is considered because the quartz plate was not dissolved in the sealant or was reprecipitated after once being dissolved.

Comparative Example 1

An ingot was prepared by the same method as Example 1 except that the amount of Si crystal added as a dopant to GaAs polycrystal was 1440 mg (240 mass ppm with respect to GaAs), a 360 g $B_2O_3$ material into which $SiO_2$ had been previously added, which contains 1.6 mass % of Si was used, and the quartz plate was not used. Resultant wafers were evaluated.

Comparative Example 2

An ingot was prepared by the same method as Example 1 except that the amount of Si crystal added as a dopant to GaAs polycrystal was 1680 mg (280 mass ppm with respect to GaAs), the quartz plate was not used, and the liquid $B_2O_3$ was not stirred. Resultant wafers were evaluated.

(Evaluation Result)

Figure 4:
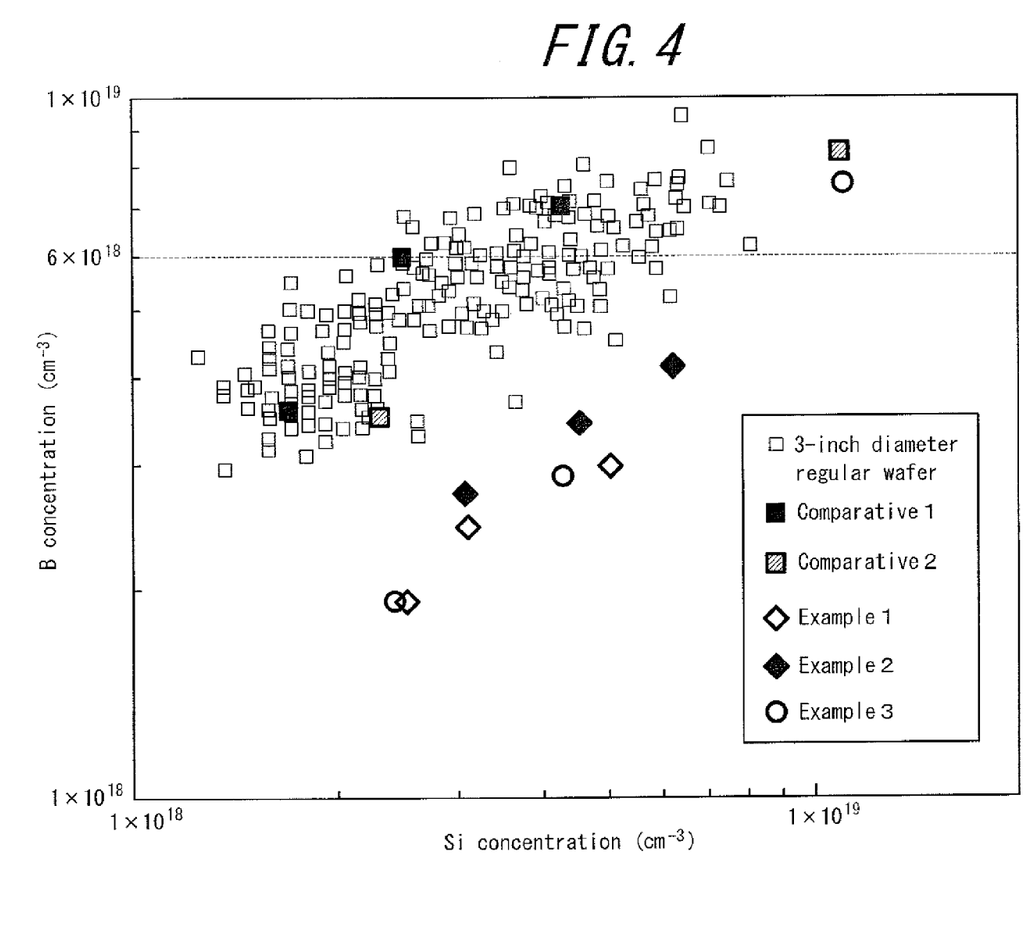
FIG. 4 is a graph showing the relationships between the concentration of Si in GaAs and the concentration of B in GaAs in Examples, Comparative Examples, and a conventional general wafer.

The evaluation results of Examples and Comparative Examples are shown in Table 1. Further, for the wafers grown in Examples and Comparative Examples, and a regular wafer grown under the same conditions as Comparative Example 1, the relationship between the concentration of Si in the GaAs crystal and the concentration of B in the GaAs crystal is shown in FIG. 4.

TABLE 1

| | | Impurities | | Carrier | EPD | |
| --- | --- | --- | --- | --- | --- | --- |
| | Position | Si concentration $cm^{-3}$ | B concentration $cm^{-3}$ | concentration $cm^{-3}$ | Maximum $cm^{-2}$ | Mean $cm^{-2}$ |
| Comparative | Seed side | 1.7E+18 | 3.6E+18 | 8.8E+17 | 300 | 11 |

TABLE 1-continued

| | Position | Impurities Si concentration cm$^{-3}$ | Impurities B concentration cm$^{-3}$ | Carrier concentration cm$^{-3}$ | EPD Maximum cm$^{-2}$ | EPD Mean cm$^{-2}$ |
|---|---|---|---|---|---|---|
| Example 1 | Middle | 2.5E+18 | 6.0E+18 | 1.2E+18 | 500 | 14 |
| | Tail side | 4.3E+18 | 6.9E+18 | 2.2E+18 | 1,500 | 49 |
| Comparative Example 2 | Seed side | 2.3E+18 | 3.6E+18 | 1.2E+18 | 200 | 22 |
| | Tail side | 1.1E+19 | 8.4E+18 | 3.8E+18 | 2,700 | 173 |
| Example 1 | Seed side | 2.5E+18 | 1.9E+18 | 1.1E+18 | 100 | 5 |
| | Middle | 3.1E+18 | 2.5E+18 | 1.6E+18 | 300 | 14 |
| | Tail side | 5.0E+18 | 3.0E+18 | 2.5E+18 | 300 | 16 |
| Example 2 | Seed side | 3.1E+18 | 2.7E+18 | 1.6E+18 | 100 | 5 |
| | Middle | 4.6E+18 | 3.4E+18 | 2.3E+18 | 100 | 8 |
| | Tail side | 6.2E+18 | 4.1E+18 | 3.1E+18 | 400 | 21 |
| Example 3 | Seed side | 2.4E+18 | 1.9E+18 | 1.1E+18 | 100 | 5 |
| | Middle | 4.3E+18 | 2.9E+18 | 2.2E+18 | 400 | 14 |
| | Tail side | 1.1E+19 | 7.5E+18 | 4.1E+18 | 2,300 | 86 |

In Example 1, the respective wafers of the seed side, the middle position, and the tail side had low EPDs, and in particular, a wafer having a carrier concentration exceeding 2×10$^{18}$ cm$^{-3}$ and a maximum EPD value of 500 cm$^{-2}$ or less was obtained from the Tail side. Further, in Example 2, such wafers were obtained from a larger range (middle position and tail side). Also in Example 3, such a wafer was obtained from the middle position.

On the other hand, in Comparative Example 1, the wafer of the tail side had a carrier concentration exceeding 2×10$^{18}$ cm$^{-3}$, yet the maximum value of the EPD was 1500 cm$^{-2}$ or less. A wafer having high carrier concentration and favorable crystallinity was not obtained. Further, as is apparent from FIG. 4, in Comparative Example 1, the B concentration exceeds 6×10$^{18}$ cm$^{-3}$ in the tail side where the Si concentration is high. This is considered to result in poor crystallinity, since generation of scum fails to be sufficiently suppressed. The same applies to Comparative Example 2.

In Example 3, the maximum value of the EPD in the tail side was significantly larger than that in Example 1. Thus, it was found preferable to stir the liquid sealant during crystal growth when a quartz plate was used.

Here, from the results of Example 1 and Comparative Example 2, the timing of the dissolution of the quartz plate in B$_2$O$_3$ will be discussed. In Example 1, Si crystal corresponding to 200 mass ppm of Si was charged into GaAs to achieve a carrier concentration of 1.1×10$^{18}$ cm$^{-3}$ in the seed side, whereas in Comparative Example 2, Si crystal corresponding to 280 mass ppm of Si was charged to achieve a carrier concentration of 1.2×10$^{18}$ cm$^{-3}$ in the seed side. Although the amount charged was larger in Comparative Example 2, there was little difference in the carrier concentration between the Comparative Examples 1 and 2. Further, it was found that the charged Si crystal was incorporated as carriers in the seed side (at the start of crystal growth) at a higher ratio in Comparative Example 1 than in Example 2. This means that before the stage of the crystal growth, that is, in the processes where B$_2$O$_3$ was softened during heating and then GaAs incited, less Si was incorporated as SiO$_2$ in B$_2$O$_3$. This suggests a phenomenon which shifts the equilibrium of the balanced chemical equation (1) to the left even during heating. It is assumed that the solid quartz plate hinders contact between the softened B$_2$O$_3$ and the GaAs material, and the quartz plate is dissolved in the softened B$_2$O$_3$ during a subsequent stage of heating to form a high SiO$_2$ concentration region in B$_2$O$_3$. In other words, the quartz plate is present as a solid even temporarily in an initial stage of heating, which makes it possible to prevent unnecessary contact between the softened B$_2$O$_3$ and the unmelted GaAs material, so that the amounts of Si and B contained in the GaAs melt in the initial stage of the crystal growth can fall within a preferred range.

In addition, from the results of Example 1, Comparative Example 1, and Comparative Example 2, a high SiO$_2$ concentration layer under B$_2$O$_3$ after melting the materials will be discussed. In Comparative Example 1, the concentration of Si in B$_2$O$_3$ was 1.6 mass % on average, whereas in Comparative Example 2, the concentration of Si in B$_2$O$_3$ was 4.0 mass % on average. Comparing the concentration of B in GaAs melt with the concentration of Si in the GaAs melt of the same level in FIG. 4, the B concentration is likely somewhat lower in Comparative Example 2 than in Comparative Example 1. Specifically, a higher concentration of Si in B$_2$O$_3$ tends to lead to a lower concentration of B in GaAs; however, even if the concentration of Si in B$_2$O$_3$ increases 2.5 times from 1.6 mass % to 4.0 mass % as in Comparative Example 1 and Comparative Example 2, the concentration of B in GaAs remains at a rather low level. In contrast, in Example 1, the concentration of Si in B$_2$O$_3$ with the amount of Si in the quartz plate being added was 5.2 mass %, which is 3.25 times that in Comparative Example 1. However, as shown in FIG. 4, the tendency of the low concentration of B in GaAs was more significant than the difference between Comparative Example 1 and Comparative Example 2. This implies that the quartz plate charged in Example 1 was not uniformly dissolved in B$_2$O$_3$ and resided as a high SiO$_2$ concentration layer having a concentration exceeding 5 mass % under the B$_2$O$_3$. Moreover, in Example 1, although 1.5 g quartz was recovered after the sealant was dissolved with alcohol after the GaAs crystal growth, it is highly probable that the 1.5 g quartz was also dissolved in B$_2$O$_3$ at least at the time of the melting of the materials, contributing to the formation of the high SiO$_2$ concentration layer.

As is evident from FIG. 4, in Examples, although the Si concentration was high, the B concentration was suppressed to a lower level than that of wafers of Comparative Examples and the conventional general wafer. This would have made it possible to produce a GaAs single crystal having high carrier concentration and high crystallinity.

INDUSTRIAL APPLICABILITY

According to the present invention, a GaAs single crystal having high carrier concentration and high crystallinity can be produced. Further, using this GaAs single crystal, a GaAs single crystal wafer having high carrier concentration and high crystallinity can be obtained.

REFERENCE SIGNS LIST

1 Lower rod
2 Upper rod
3 Crucible receiving container
4 Crucible
5 Airtight container
6A, 6B Sealing ring
7 Stirring plate 8 Heat insulator
9 Heater
10 Seed crystal
12 Si material
14 GaAs material
15 Melted portion (GaAs melt)
16 Quartz plate (solid silicon dioxide)
17 High $SiO_2$ concentration layer
18 Boron oxide material
19 Liquid boron oxide (liquid sealant)
20 Solidified portion (Si-doped GaAs single crystal)

The invention claimed is:

1. A method of producing a GaAs single crystal, wherein a vertical boat method is performed with a crucible storing a seed crystal, a Si material serving as an impurity, a GaAs material, a solid silicon dioxide, and a boron oxide material in which $SiO_2$ is previously added into the boron oxide material, thereby growing a GaAs single crystal,
wherein the solid silicon dioxide is in a disk shape and is provided between the GaAs material and the boron oxide material,
a ratio of an area of the solid silicon dioxide to an area of the upper surface of the GaAs material at a start of crystal growth is 90% to 99%,
an amount of Si of $SiO_2$ previously added into the boron oxide material is 5 mass % or less, and
a sum of an amount of Si of $SiO_2$ in the boron oxide material and an amount of Si in the solid silicon dioxide exceeds 5 mass % of the boron oxide material.

2. The method of producing a GaAs single crystal according to claim 1, wherein in a specific period in the growth of the GaAs single crystal, liquid boron oxide which is a melt of the boron oxide material is stirred.

3. A Si-doped GaAs single crystal wafer, wherein a carrier concentration is higher than $2 \times 10^{18}$ $cm^{-3}$, the maximum value of an etch pit density is 500 $cm^{-2}$ or less, the B concentration is in a range of $1.9 \times 10^{18}$ $cm^{-3}$ to $6.0 \times 10^{18}$ $cm^{-3}$, and the Si concentration is in a range of $4.3 \times 10^{18}$ $cm^{-3}$ to $6.2 \times 10^{18}$ $cm^{-3}$.

4. The method of producing a GaAs single crystal according to claim 1, wherein in a specific period in the growth of the GaAs single crystal, liquid boron oxide which is a melt of the boron oxide material is stirred.

5. The Si-doped GaAs single crystal wafer according to claim 3, wherein a carrier concentration is $2 \times 10^{18}$ $cm^{-3}$ to $3.1 \times 10^{18}$ $cm^{-3}$.

6. The Si-doped GaAs single crystal wafer according to claim 3, wherein an average value of an etch pit density is 8 $cm^{-2}$ to 21 $cm^{-2}$.

7. The Si-doped GaAs single crystal wafer according to claim 5, wherein an average value of an etch pit density is 8 $cm^{-2}$ to 21 $cm^{-2}$.

* * * * *